United States Patent
Morita et al.

(10) Patent No.: US 9,287,082 B2
(45) Date of Patent: Mar. 15, 2016

(54) CHARGED PARTICLE BEAM APPARATUS

(71) Applicant: Hitachi High-Technologies Corporation, Minato-ku, Tokyo (JP)

(72) Inventors: Kenichi Morita, Tokyo (JP); Sayaka Tanimoto, Tokyo (JP); Makoto Sakakibara, Tokyo (JP); Muneyuki Fukuda, Tokyo (JP); Naomasa Suzuki, Tokyo (JP); Kenji Obara, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/616,658

(22) Filed: Feb. 7, 2015

(65) Prior Publication Data

US 2015/0228443 A1 Aug. 13, 2015

(30) Foreign Application Priority Data

Feb. 7, 2014 (JP) ................................. 2014-021837

(51) Int. Cl.
- *H01J 37/141* (2006.01)
- *H01J 37/28* (2006.01)
- *H01J 37/26* (2006.01)
- *H01J 37/22* (2006.01)

(52) U.S. Cl.
CPC .............. *H01J 37/141* (2013.01); *H01J 37/222* (2013.01); *H01J 37/261* (2013.01); *H01J 2237/04922* (2013.01); *H01J 2237/2801* (2013.01); *H01J 2237/2806* (2013.01); *H01J 2237/2809* (2013.01)

(58) Field of Classification Search
CPC ......... H01J 37/28; H01J 37/21; H01J 37/265; H01J 37/10; H01J 37/141

USPC ............... 250/310, 306, 311, 396 R, 492.2, 250/396 ML
See application file for complete search history.

(56) References Cited

U.S. PATENT DOCUMENTS

| | | | | |
|---|---|---|---|---|
| 4,999,496 A * | 3/1991 | Shaw | ..................... | H01J 37/21 250/306 |
| 7,241,996 B2 * | 7/2007 | Suzuki | ..................... | H01J 37/21 250/306 |
| 7,888,640 B2 * | 2/2011 | Tachibana | ........... | G01N 23/225 250/307 |
| 2002/0056808 A1 * | 5/2002 | Tsuneta | .................. | H01J 37/21 250/306 |
| 2006/0226362 A1 * | 10/2006 | Kitsuki | ................... | H01J 37/04 250/310 |
| 2007/0228922 A1 * | 10/2007 | Nakasuji | ................. | H01J 3/029 313/364 |
| 2008/0310704 A1 | 12/2008 | Tachibana et al. | | |
| 2011/0163229 A1 * | 7/2011 | Frosien | ................... | H01J 37/05 250/310 |
| 2015/0228443 A1 * | 8/2015 | Morita | .................. | H01J 37/141 250/310 |

FOREIGN PATENT DOCUMENTS

| | | |
|---|---|---|
| JP | 5-242845 A | 9/1993 |
| JP | 2009-26749 A | 2/2009 |
| JP | 2010-519698 T | 6/2010 |

\* cited by examiner

*Primary Examiner* — David A Vanore

(74) *Attorney, Agent, or Firm* — Miles & Stockbridge P.C.

(57) ABSTRACT

A charged particle beam apparatus includes a charged particle beam source which irradiates a sample with a charged particle beam, an electromagnetic lens, a lens control electric source for controlling strength of a convergence effect of the electromagnetic lens; and a phase compensation circuit which is connected to the lens control electric source in parallel with the electromagnetic lens, and controls a lens current at the time of switching the strength of the convergence effect of the electromagnetic lens such that the lens current monotonically increases or monotonically decreases.

12 Claims, 11 Drawing Sheets

FIG. 4

SETTING SCREEN OF IMAGING CONDITION

| ACCELERATION VOLTAGE | : | | V | | | | |
|---|---|---|---|---|---|---|---|
| LOW MAGNIFICATION IMAGING | | | | HIGH MAGNIFICATION IMAGING | | | |
| BEAM CURRENT | : | | pA | BEAM CURRENT | : | | pA |
| HALF OPENING ANGLE | : | | mrad | HALF OPENING ANGLE | : | | mrad |
| IMAGING REGION | : | | um | IMAGING REGION | : | | um |
| IMAGE SIZE | : | | pixel | IMAGE SIZE | : | | pixel |
| NUMBER OF FRAMES | : | | frm | NUMBER OF FRAMES | : | | frm |
| SCANNING SPEED | : | | ms/frm | SCANNING SPEED | : | | ms/frm |
| CURRENT DENSITY | : | | | CURRENT DENSITY | : | | |

FIG. 5

MODE SELECTION

☑ USE SHORTEST RECOMMENDED STANDBY TIME VALUE
    10 ms

☐ USE SHORTEST RECOMMENDED STANDBY TIME VALUE IN WHICH VARIATION IN BEAM AND HALF OPENING ANGLE IS MINIMUM
    100 ms

☐ SELECT STANDBY TIME FROM LIST
    ms

AMOUNT OF VARIATION IN BEAM CURRENT AND HALF OPENING ANGLE

| BEAM CURRENT | : | | pA |
|---|---|---|---|
| HALF OPENING ANGLE | : | | DEGREES |

CHARGED PARTICLE BEAM APPARATUS

CROSS-REFERENCE TO RELATED APPLICATION

This application claims the priority of Japanese Patent Application No. 2014-021837 filed Feb. 7, 2014, which is incorporated herein by reference in its entirety.

BACKGROUND OF THE INVENTION

1. Field of the Invention

The present invention relates to a charged particle beam apparatus. More specifically, the present invention relates to a charged particle beam apparatus which irradiates a sample with a charged particle beam and detects charged particles emitted from an irradiation position.

2. Background Art

According to refinement of a pattern on a semiconductor wafer, it has been difficult to perform defect detection, observation, and length dimension measurement of a pattern width by an optical microscope type inspection device, and thus inspection, review, and length measurement based on an image-imaging have been performed by a scanning electron microscope (hereinafter, referred to as "Scanning Electron Microscopy (SEM)"). Hereinafter, an SEM will be described as an example.

An SEM irradiates a sample surface with an electron beam which converges on the sample surface, and detects secondary electrons or reflected electrons emitted from the irradiation position. Then, by two-dimensionally moving the irradiation position of the electron beam, a two-dimensional image is imaged.

An expected value of the number of secondary electrons and the number of reflected electrons which are emitted when the sample surface is irradiated with the electron beam is proportionate to a beam current controlling an electron beam emission quantity. However, a variation occurs in the number of secondary electrons or the number of reflected electrons which are emitted, and the variation is proportionate to the number of electrons which are emitted to the power of 0.5. The variation is a major cause of noise in an image detected by the SEM.

When an S/N ratio of an imaged image is considered, a signal component is proportionate to the beam current, and the variation which is a noise component is proportionate to the beam current to the power of 0.5, and thus the S/N ratio is proportionate to the beam current to the power of 0.5. According to these characteristics, it is necessary to image an image by using the largest beam current in order to obtain an image having an excellent S/N ratio. However, when the beam current increases, an aberration in an electron optical system increases, and thus a high resolution image is not able to be obtained. That is, a resolution and an S/N ratio are in a trade-off relationship.

In order to solve these problems, as a technique for improving an S/N ratio without using a beam current, a technique of reducing noise by frame addition is included. This is a method in which an image of the same region is imaged a plurality of times, each image is set as a frame, and a final image is synthesized by summing the frames. When this method is used, an S/N ratio is proportionate to the number of frames to the power of 0.5. However, an imaging time increases in proportion to the number of frames.

As described above, the S/N ratio of the imaged image is proportionate to a product of the beam current and the number of frames, to the power of 0.5 and the imaging time is proportionate to the number of frames.

When a defect of a semiconductor is reviewed or a dimension of a semiconductor pattern is measured by the SEM having these characteristics, in general, imaging is continuously performed in two types of conditions of low magnification and high magnification. For example, in a review SEM reviewing a defect of a semiconductor, the defect is displayed by being enlarged in high magnification based on defect coordinates output by an inspection device which detects the defect, but accuracy of the defect coordinates output by the inspection device is low, and the defect may not converge in a high magnification image. For this reason, before imaging a high magnification image, a defect image in low magnification and a reference image are compared to specify a defect position, and then an imaging region is adjusted and the high magnification image is imaged. Similarly, in a length measurement SEM, in order to determine a pattern to be measured, a low magnification image is imaged, and then an image is imaged in high magnification, and a line width or the like is measured from the imaged image with high accuracy.

As a method for improving a throughput of the continuous imaging, a method in which a beam current is switched to be a large beam current at the time of low magnification imaging, and the number of frames is decreased, and thus an imaging time at the time of the low magnification imaging is shortened is considered. This method is premised on the principle that both a resolution and an S/N ratio are obtained in high magnification imaging, and when the S/N ratio of the low magnification imaging is identical to that of the high magnification imaging, the resolution may be lower than that of the high magnification imaging.

Regarding the related art which realizes switching of a beam current, in JP-T-2010-519698, a plurality of opening diaphragms having different diameters is used in an opening diaphragm shielding a beam current, and the opening diaphragm is switched, and thus the beam current is switched. However, a switching rate of the beam current depends on an operating variation in the diameter of the opening diaphragm, or a half opening angle varies at the time of switching the beam current.

In JP-A-2009-26749, in order to switch a beam current, an electrostatic lens is superimposed on an electromagnetic lens, and a strength of a convergence effect of the electrostatic lens is changed, and thus an amount of beam shielded by an opening diaphragm is controlled. However, in order to realize an aberration in the electrostatic lens which is identical to that in the electromagnetic lens, a stable high voltage electric source is necessary, but a stable high voltage electric source which is able to perform rapid switching is not easily manufactured, and a cost increases as the number of components of the lens and the electric source increases.

In the related art for a beam current switching technique not using the above-described method of switching the opening diaphragm having different diameters, or the above-described method of switching the strength of the convergence effect of the electrostatic lens, JP-A-5-242845 is included. In JP-A-5-242845, an optical system is configured by three or more stages of electromagnetic lenses, and changes the strength of the convergence effect of the electromagnetic lens, and thus is able to switch at least any one of a beam current, a half opening angle, and a convergence position of a beam in a sample surface.

When lens action and an aberration occur to the same degree, the electromagnetic lens is able to be controlled with a small electric source compared to an electrostatic lens. In addition, the beam current is controlled by using the electromagnetic lens and an opening diaphragm, and the strength of the convergence effect of the electromagnetic lens, and thus the beam current is more easily and accurately adjusted to a desired beam current. In addition, when comparing to the methods of JP-T-2010-519698 and JP-A-2009-26749, it is not necessary to add an optical system for switching the beam current or the half opening angle, and thus an optical axis deviation due to a variation over time for positioning the optical system hardly occurs.

When the strength of the convergence effect of the electromagnetic lens is switched, a magnetic flux density in a trajectory through which a charged particle beam passes after being switched is changed over time by ringing of a lens current due to inductive reactance of the electromagnetic lens and a variation over time due to response delay. Further, a variation over time due to a magnetic aftereffect of a magnetic path material of the lens is superimposed on the variation over time in the magnetic flux density. Therefore, the strength of the convergence effect of the electromagnetic lens changes in a complex manner over time. Furthermore, ringing is a state in which a signal transitions to a convergence value while vibrating at the time of the strength of the signal changing, or an aspect thereof. For this reason, when the strength of the convergence effect of the electromagnetic lens is switched, the following problems occur.

First, since ringing occurs in the strength of the convergence effect of the electromagnetic lens, an amount of variation in the strength of the convergence effect of the electromagnetic lens per unit time is greater, and a standby time during which the variation converges to an amount which is allowable during imaging one image is prolonged.

Second, the standby time in which the variation in the strength of the convergence effect of the electromagnetic lens converges to the amount of variation which is allowable during imaging one image changes according to a switching width of the lens current, and thus it is difficult to ascertain a relationship between the switching width of the current and the standby time. For this reason, even when the switching width of the current is small, it is necessary to start the imaging after a standby time of a maximum switching width of the current or a time longer than the standby time has elapsed.

Third, a standby time in which the strength of the convergence effect of the electromagnetic lens converges in a normal state is prolonged.

As a result thereof, the strength of the convergence effect of the electromagnetic lens is changed, and thus in the charged particle beam apparatus having a configuration of switching at least any one of the beam current, the half opening angle, and the convergence position of the beam in the sample surface, it is not possible to perform the imaging by rapidly switching the beam current, the half opening angle, and the convergence position of the beam in the sample surface.

SUMMARY OF THE INVENTION

According to a representative aspect of the present invention, there is provided a charged particle beam apparatus including a charged particle beam source which irradiates a sample with a charged particle beam; an electromagnetic lens; a lens control electric source for controlling strength of a convergence effect of the electromagnetic lens; and a phase compensation circuit which is connected to the lens control electric source in parallel with the electromagnetic lens, and controls a lens current at the time of switching the strength of the convergence effect of the electromagnetic lens such that the lens current monotonically increases or monotonically decreases.

In the charged particle beam apparatus, the imaging is more easily performed when rapidly switching the beam current, the half opening angle, and the convergence position of the beam.

BRIEF DESCRIPTION OF THE DRAWINGS

FIG. 4 is an example of a setting screen of a plurality of imaging conditions.

FIG. 5 is an example of a screen for switching a setting mode of a standby time.

DETAILED DESCRIPTION OF THE INVENTION

Figure 1A:
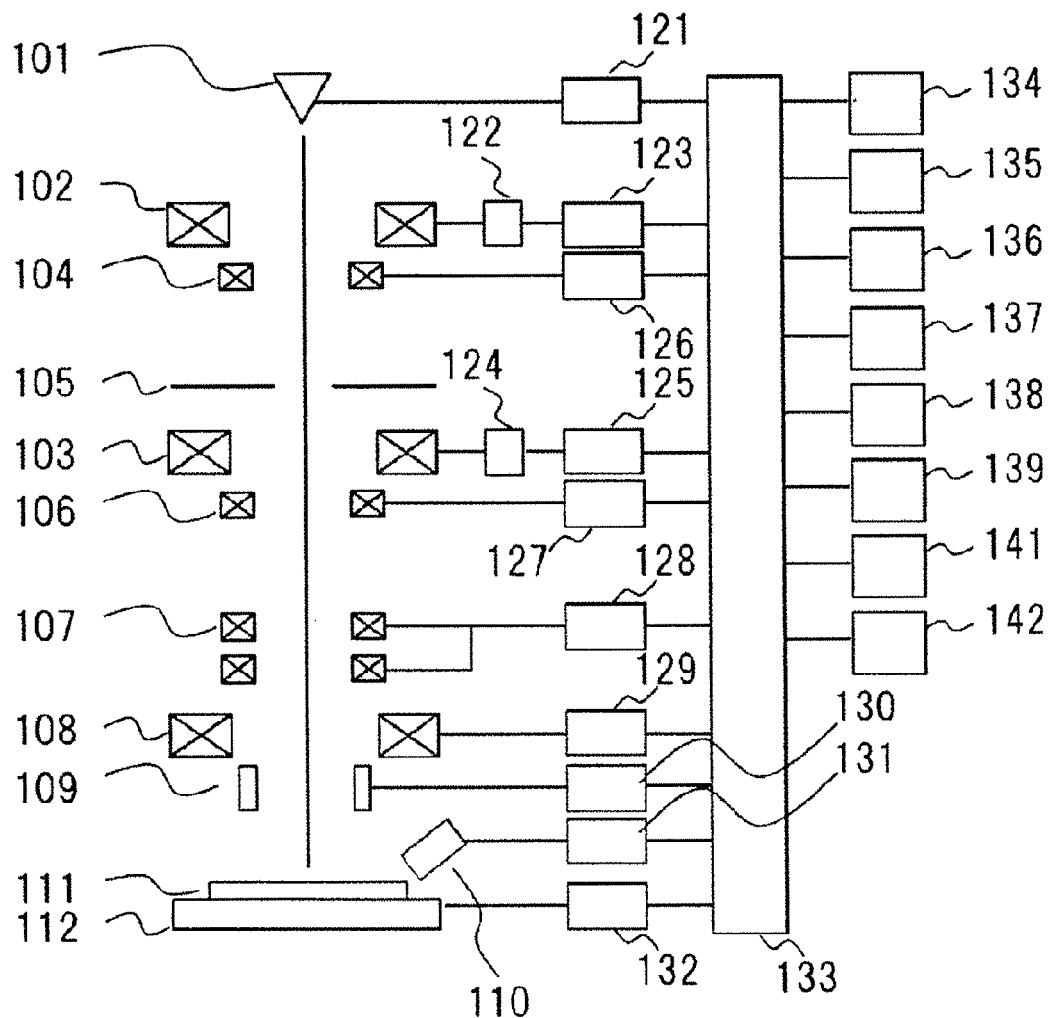
FIGS. 1A and 1B are configuration diagrams of a charged particle beam apparatus according to one embodiment of the invention.

Hereinafter, Examples will be described with reference to the drawings. Furthermore, in all drawings for illustrating embodiments, the same reference numerals are applied to the same members in general, and the repeated description thereof will be omitted. In addition, among different Examples, contents which are simultaneously established are able to be combined.

Example 1

In this example, a configuration of a review SEM according to one embodiment of the invention, and a sequence of performing a defect inspection while switching both a beam current and a half opening angle by using the review SEM of this example will be described.

FIG. 1 is an example of a configuration diagram of a review SEM according to this embodiment. The review SEM according to this embodiment includes an electron beam source 101, condenser lenses 102 and 103, an objective diaphragm 105, electron beam axis adjustment instruments 104 and 106, a scanning unit 107, an objective electromagnetic lens 108, an objective electrostatic lens 109, a detector 110, an XY stage 112, an electron beam source control electric source 121, phase compensation circuits 122 and 124, condenser lens control electric sources 123 and 125, electron beam axis adjustment instrument control electric sources 126 and 127, a scanning unit control electric source 128, an objective electromagnetic lens control electric source 129, an objective electrostatic lens control electric source 130, a detection value adjustment device 131, a stage driving electric source 132, an arithmetic device 133 totally controlling a whole system, a memory 134, a secondary storage device 135, a wafer information storage unit 136, a display device 137 associated with the arithmetic device 133, an input device 138, an image processing unit 139, a standby time adjustment memory 141, an imaging conditions memory 142, and the like, and performs a defect inspection with respect to a wafer 111.

In the review SEM according to this embodiment, an electromagnetic lens is used as the condenser lenses 102 and 103. Then, as illustrated in a connection diagram in FIG. 1B, the phase compensation circuit 122 is disposed in parallel with the electromagnetic lens 102 with respect to the condenser lens control electric source 123, and the phase compensation circuit 124 is disposed in parallel with the electromagnetic lens 103 with respect to the condenser lens control electric source 125.

Figure 1B:
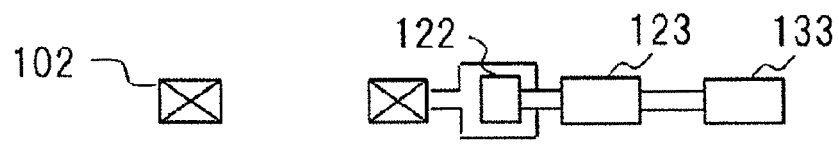

Furthermore, as illustrated in FIG. 1B, the phase compensation circuit 122 may be positioned in parallel with the condenser lens 102 when viewed from the condenser lens control electric source 123, the phase compensation circuit 122 may be positioned on a side close to the condenser lens control electric source 123, and the condenser lens 102 may be positioned on a side close to the condenser lens control electric source 123. The same applies to the phase compensation circuit 124.

In addition, in the objective electrostatic lens 109, a boosting optical system or a retarding optical system may be used.

In the review SEM according to this embodiment, as a charged particle beam, in particular, an electron beam is used. A beam current control unit includes the condenser lens 102, the objective diaphragm 105, the condenser lens control electric source 123, and the phase compensation circuit 122. A half opening angle control unit includes the condenser lens 103, the condenser lens control electric source 125, and the phase compensation circuit 124. A beam convergence control unit includes the objective electromagnetic lens 108, the objective electrostatic lens 109, the objective electromagnetic lens control electric source 129, and the objective electrostatic lens control electric source 130. A beam deflection control unit includes the electron beam axis adjustment instruments 104 and 106, and the scanning unit 107. A beam scanning unit includes the scanning unit 107. A signal gain control unit is implemented by the detection value adjustment device 131. A standby time control unit, a standby time determination unit, an optical condition control unit, and an image forming unit are implemented by the arithmetic device 133.

Next, an operation of the review SEM according to this embodiment will be described with reference to FIGS. 1A and 1B.

The electron beam emitted by the electron beam source 101 passes through the condenser lenses 102 and 103, and astigmatism or an alignment deviation is corrected by the electron beam axis adjustment instruments 104 and 106. The electron beam is shielded by the objective diaphragm 105. The beam current emitted to the wafer 111 is controlled by changing a strength of a convergence effect of the condenser lens 102 and by changing a shielding amount by the objective diaphragm 105. Further, the electron beam is deflected by the scanning unit 107 such that the electron beam is emitted to a desired position on the wafer 111, is converged by the objective electromagnetic lens 108 and the objective electrostatic lens 109, and is emitted to an observation target of the wafer 111. When the wafer ill is irradiated with the electron beam, secondary electrons and reflected electrons are emitted from the wafer 111, and a signal is detected by the electron detector 110. Gain adjustment and offset adjustment of a detection value and conversion to a digital signal are performed by the detection value adjustment device 131, and the digital signal is stored in the memory 134 as an image. Herein, this image formation is described as imaging. Furthermore, in the gain adjustment and the offset adjustment, when voltage control or current control of the detector 110 is necessary, the control is performed by the detector adjustment device 131.

The stage driving electric source 132 and the XY stage 112 move the wafer 111, and thus an arbitrary position on the wafer 111 is able to be imaged.

The secondary storage device 135 is able to store the image stored in the memory 134.

The image processing unit 139 detects a defect position based on the image stored in the memory 134 and the secondary storage device 135. As a detection method, a method in which a position having a difference is detected as a defect by comparing an image of the defect position and a reference image is used. The reference image is an image which has the same pattern as that of the image of the defect position and does not have a defect.

The imaging conditions memory 142 and the secondary storage device 135 are able to store a plurality of combinations configured by a control value of the condenser lens control electric sources 123 and 125, and at least any one control value of the scanning unit control electric source 128.

Figure 13:
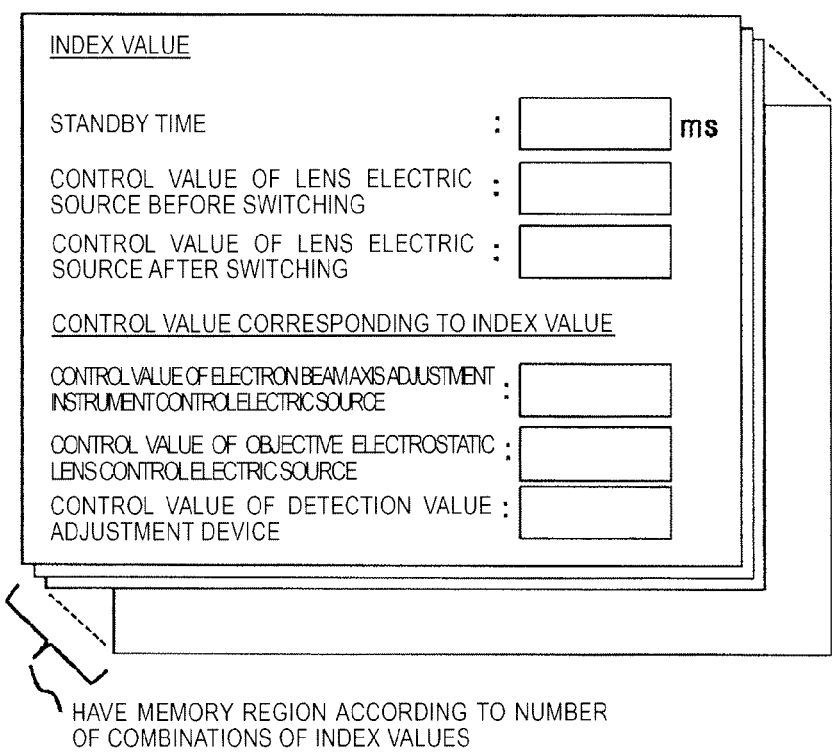
FIG. 13 is an example of a standby time adjustment memory.

FIG. 13 is an example of the standby time adjustment memory 141.

In the standby time adjustment memory 141 and the secondary storage device 135, as illustrated in FIG. 13, the control value of the condenser lens control electric sources 123 and 125 before and after switching a beam current and a half opening angle, and the standby time 140 from a starting point of change of the control value of the condenser lens control electric sources 123 and 125 to an imaging starting point are set as an index value, a combination of the respective control values of the electron beam axis adjustment instrument control electric sources 126 and 127, the objective electromagnetic lens control electric source 129, the objective electrostatic lens control electric source 130, and the detection value adjustment device 131 is set as one set, and a plurality of sets are able to be stored. Furthermore, in the standby time adjustment memory 141 and the secondary storage device 135, a program for calculating a control value may be stored instead of these control values. For example, a method in which when a plurality of sets of combinations of different control values of the standby time 140 is stored, on the basis of a control value of the shortest standby time 140 and a control value of the longest standby time 140, a control value of a standby time 140 between the shortest standby time 140 and the longest standby time 140 is calculated is considered.

The arithmetic device 133 is able to perform control, synchronous processing, and parallel processing with respect to the image processing unit 139, the condenser lens control electric sources 123 and 125, the electron beam axis adjustment instrument control electric sources 126 and 127, the scanning unit control electric source 128, the objective electromagnetic lens control electric source 129, the objective electrostatic lens control electric source 130, the detection value adjustment device 131, and the stage driving electric source 132. Therefore, the arithmetic device 133 changes the control value of the condenser lens control electric sources 123 and 125 based on the control value stored in the imaging conditions memory 142 and the standby time adjustment memory 141, changes the control value of the electron beam axis adjustment instrument control electric sources 126 and 127, the objective electromagnetic lens control electric source 129, the objective electrostatic lens control electric source 130, and the detection value adjustment device 131 before the standby time 140 has elapsed from the change, controls the scanning unit control electric source 128 after the standby time 140 has elapsed, and thus is able to start the imaging. The display device 137 is able to display the image stored in the memory 134 or the secondary storage device 135. In addition, a user is able to set various operations of this apparatus by using the input device 138.

Here, the switching of the beam current and the half opening angle will be described in detail.

The beam current emitted to the wafer 111 is controlled by beam current control means of the condenser lens 102, the objective diaphragm 105, the condenser lens control electric source 123, and the phase compensation circuit 122. The half opening angle is control led by half opening angle control means of the condenser lens 103, the condenser lens control electric source 125, and the phase compensation circuit 124. The beam current and the half opening angle are able to be independently controlled.

When the beam current control means including the condenser lens 102 and the objective diaphragm 105 is used, the half opening angle increases in conjunction with an increase in the beam current, the half opening angle being able to be controlled by the condenser lens 103 such that the half opening angle is constant without using the beam current.

In addition, the half opening angle is able to be controlled such that the half opening angle decreases when the beam current increases. In the defect inspection by using the review SEM, when a defect position in low magnification imaging is extracted, it is possible to shorten an imaging time by increasing the beam current and by decreasing the number of frames. When defect position coordinates are extracted, it is necessary to image defects having different heights without an image blur, and a deep focal depth is required. For this reason, when the beam current increases, it is important to control the half opening angle such that the half opening angle decreases.

When the strength of the convergence effect of at least any one lens of the condenser lenses 102 and 103 is changed, the objective electromagnetic lens 108 and the objective electrostatic lens 109 are adjusted such that the beam converges on the wafer 111.

Figure 2A:
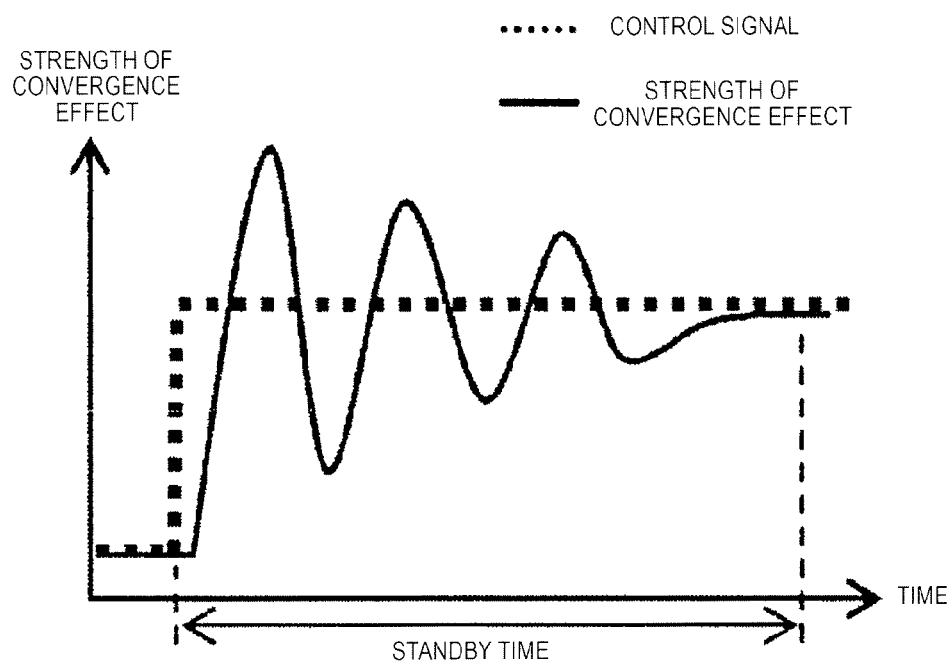
FIGS. 2A and 2B are diagrams illustrating a difference in a variation over time in the strength of the convergence effect of an electromagnetic lens depending on the presence or absence of a phase compensation circuit.
Figure 2B:
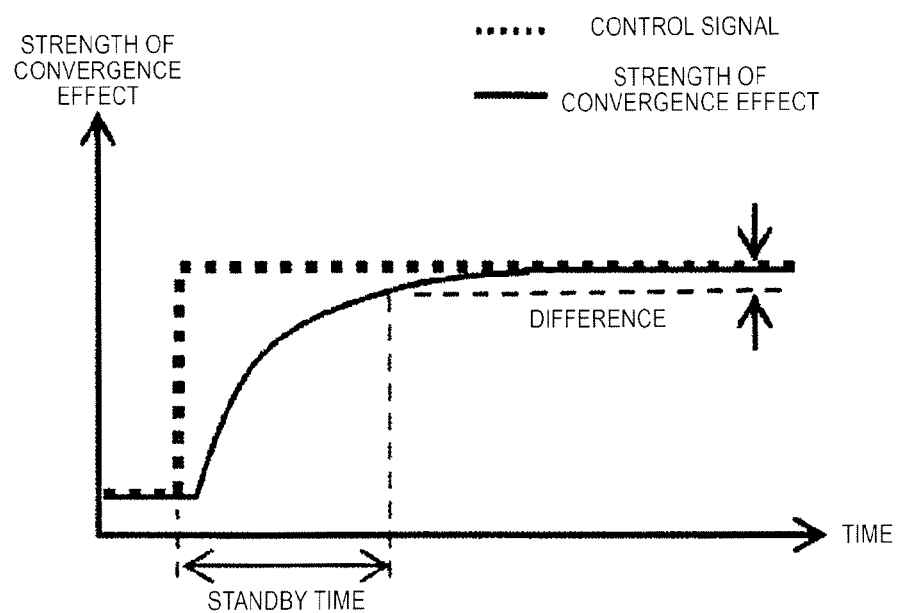

FIG. 2A is an example of a variation over time in the strength of the convergence effect of an electromagnetic lens when a phase compensation circuit is not disposed, and FIG. 2B is an example of the variation over time in the strength of the convergence effect of the electromagnetic lens when the phase compensation circuit is disposed.

When the phase compensation circuits 122 and 124 are not disposed, a variation at the time of switching the strength of the convergence effect of the electromagnetic lens is as illustrated in FIG. 2A. This is because ringing of a lens current due to inductive reactance of the electromagnetic lens and a variation over time in magnetic flux density due to response delay occur, and a magnetic aftereffect of a magnetic path material is superimposed on a the variation over time in the magnetic flux density. Further, the ringing of the lens current depends on an initial value of the lens current and a current switching width, and thus it is difficult to predict a variation in the strength of the convergence effect of the lens. In addition, since the ringing occurs in the strength of the convergence effect of the lens, an amount of variation per unit time is greater. Even when the strength of the convergence effect of the lens varies, the imaging is able to be performed insofar as a variation in image quality due to the variation in the strength of the convergence effect of the lens during the imaging is within an allowable range, but an amount of variation in the strength of the convergence effect of the lens per unit time is greater, and thus a time period during which the variation in the image quality converges to an allowable range is prolonged. Furthermore, the variation in the image quality occurs due to the variation in the beam current and the half opening angle due to the variation in the strength of the convergence effect of the electromagnetic lens, a deviation in brightness or contrast of an image due to the variation in the beam current, a visual deviation based on the variation in the strength of the convergence effect of the electromagnetic lens, an image blur, and the like. The variation in the image quality is able to be quantitatively evaluated by brightness, contrast, sharpness, an S/N ratio, and the like of the image. Next, an example of each calculation method will be described. The variation in the brightness is able to be calculated by obtaining an offset amount of variation in each pixel value included in the image. The variation in the contrast is able to be calculated by obtaining a variation in a difference between a maximum value and a minimum value of each of the pixel values. The variation in the sharpness is able to be calculated by obtaining a variation in a differential value due to a distance between pixels of pixel values of adjacent pixels. The variation in the S/N ratio is able to be calculated by obtaining a variation in a value obtained by dividing a signal component of a pixel value by a noise component of a pixel value.

In contrast, when the phase compensation circuits 122 and 124 are disposed, the variation at the time of switching the strength of the convergence effect of the electromagnetic lens is as illustrated in FIG. 2B. By adjusting the phase compensation circuits 122 and 124 such that a transient response of the lens current at the time of switching the lens current monotonically increases (decreases), the variation over time in the strength of the convergence effect of the lens monotonically increases (decreases). The phase compensation circuits 122 and 124 are circuits including a resistor and a capacitor, and values thereof are adjusted, and thus it is possible to adjust a transient response waveform of the lens current.

Thus, the charged particle beam apparatus according to this example includes the charged particle beam source 101 which irradiates the sample with the charged particle beam, the electromagnetic lenses 102 and 103, the lens control electric sources 123 and 125 for controlling the strength of the convergence effect of the electromagnetic lens, and the phase compensation circuits 122 and 124 which are connected to the lens control electric source in parallel with the condenser lens and control the lens current at the time of switching the strength of the convergence effect of the electromagnetic lens such that the lens current monotonically increases or monotonically decreases.

According to this configuration, the following effects are obtained. First, a response delay time of the lens current is shortened, and thus a time period during which the strength of the convergence effect of the electromagnetic lens converges in a normal state is shortened.

Second, the ringing of the lens current is able to be considerably lower, and thus the variation in the strength of the convergence effect of the electromagnetic lens is monotonous, and the amount of variation per unit time decreases. For this reason, a time during which the variation converges to an amount which is allowable during imaging one image is shortened, and a standby time from a time point of switching the lens current to a time point at which the imaging is able to be started is shortened. In addition, the variation in the strength of the convergence effect of the electromagnetic lens is monotonous, and thus it is possible to predict the variation.

Further, the charged particle beam apparatus according to this example further includes the detector 110 which detects secondary charged particles occurring due to irradiating the sample with the charged particle beam, the image forming unit which forms an image based on a signal of the detector, the standby time control unit (the arithmetic device 133) which controls the standby time from switching the strength of the convergence effect of the electromagnetic lens to starting image generation of the sample, and the standby time adjustment memory 141 which stores the standby time and a plurality of control parameters of the charged particle beam apparatus corresponding to the control value of the electromagnetic lens.

According to this configuration, the standby time from switching the lens current to starting the imaging is controlled, and thus it is possible to perform imaging by reproducing the same strength of the convergence effect of the lens even during the variation over time in the strength of the convergence effect of the electromagnetic lens. In particular, the standby time control unit sets the standby time to be within a time period during which the variation in the image quality converges to a predetermined range based on the variation in the strength of the convergence effect of the electromagnetic lens within a forming time of one image by the image forming unit. Thus, even when the strength of the convergence effect of the lens is in a transient state, an optical condition is adjusted according to the strength of the convergence effect of the electromagnetic lens at the time point of performing the imaging, and thus it is possible to perform the imaging by adjusting the image quality within an allowable range necessary for the defect inspection.

The control parameters stored in the standby time adjustment memory include at least one of a deflection control value of the charged particle beam, a control value of signal gain of the detector, and a control value of the beam convergence control unit for allowing the charged particle beam to converge. Furthermore, when the strength of the convergence effect of the lens varies over time, it is possible to predict the strength of the convergence effect of the lens after the standby time 140 has elapsed from starting the switching by a value before and after switching the control value of a lens electric source and the standby time 140. From these reasons, the standby time adjustment memory 141 may store not only the control value of the condenser lens control electric sources 123 and 125 after switching the beam current and the half opening angle, but also the control value of the condenser lens control electric sources 123 and 125 before switching the beam current and the half opening angle.

Next, an adjustment method of the optical condition will be described. Each control value of the electron beam axis adjustment instrument control electric sources 126 and 127, the objective electromagnetic lens control electric source 129, the objective electrostatic lens control electric source 130, and the detection value adjustment device 131 which is optimal with respect to the strength of the convergence effect of the condenser lenses 102 and 103 after the standby time 140 has elapsed from the starting point of change of the control value of the condenser lens control electric sources 123 and 125 may be stored in the standby time adjustment memory 141 or the secondary storage device 135 in advance, and may be read at the time of switching the current and the half opening angle. Each of the control values are acquired by the following sequence, and is stored in the standby time adjustment memory 141 and the secondary storage device 135.

First, after the standby time 140 has elapsed from the starting point of change of the control value of the condenser lens control electric sources 123 and 125, when an influence of the variation in the strength of the convergence effect of the electromagnetic lens is in an allowable range in a time range according to an automatic axis adjustment function, an automatic brightness and contrast adjustment function, and an automatic focus adjustment function, an adjustment value of the electron beam axis adjustment instrument control electric sources 126 and 127, the objective electromagnetic lens control electric source 129, the objective electrostatic lens control electric source 130, and the detection value adjustment device 131 is obtained by these automatic adjustment functions. In contrast, when the influence of the variation in the strength of the convergence effect of the electromagnetic lens is not in the allowable range in the time range according to the automatic adjustment function, the control value of the condenser lens control electric sources 123 and 125 which is able to reproduce the strength of the convergence effect electromagnetic lens in the normal state after the standby time 140 has elapsed is used, and the adjustment value of the electron beam axis adjustment instrument control electric sources 126 and 127, the objective electromagnetic lens control electric source 129, the objective electrostatic lens control electric source 130, and the detection value adjustment device 131 is obtained by the automatic adjustment function by waiting until the strength of the convergence effect of the electromagnetic lens converges in the normal state.

The standby time 140 is set to a time period during which the variation in the image quality within an imaging range of one image is in an allowable range. When a plurality of frames is imaged in the imaging of one image, a time period during which the variation in the image quality within an imaging time of the plurality of frames is in an allowable range is set to the standby time 140.

Furthermore, as described above, the time period from the starting point of switching the lens current of the electromagnetic lens to the starting point of performing the imaging is shortened by the phase compensation circuits 122 and 124, but it should be noted that the noise component of the lens current may slightly increase.

FIG. 1 illustrates a configuration example of a case where the beam is converged by the objective electromagnetic lens 108 and the objective electrostatic lens 109 on the wafer 111, the variation in a beam convergence position due to the variation in the strength of the condenser lenses 102 and 103 is suppressed only by the objective electrostatic lens 109, and the strength of the objective electromagnetic lens 108 is not changed, and the phase compensation circuit is not disposed in parallel with the objective electromagnetic lens 108. This is because when the phase compensation circuit is disposed in parallel with the electromagnetic lens, the noise component of the lens current may slightly increase. However, the variation in the beam convergence position may be suppressed by the objective electromagnetic lens 108, and in this case, the phase compensation circuit is disposed in parallel with the objective electromagnetic lens 108.

Figure 3:
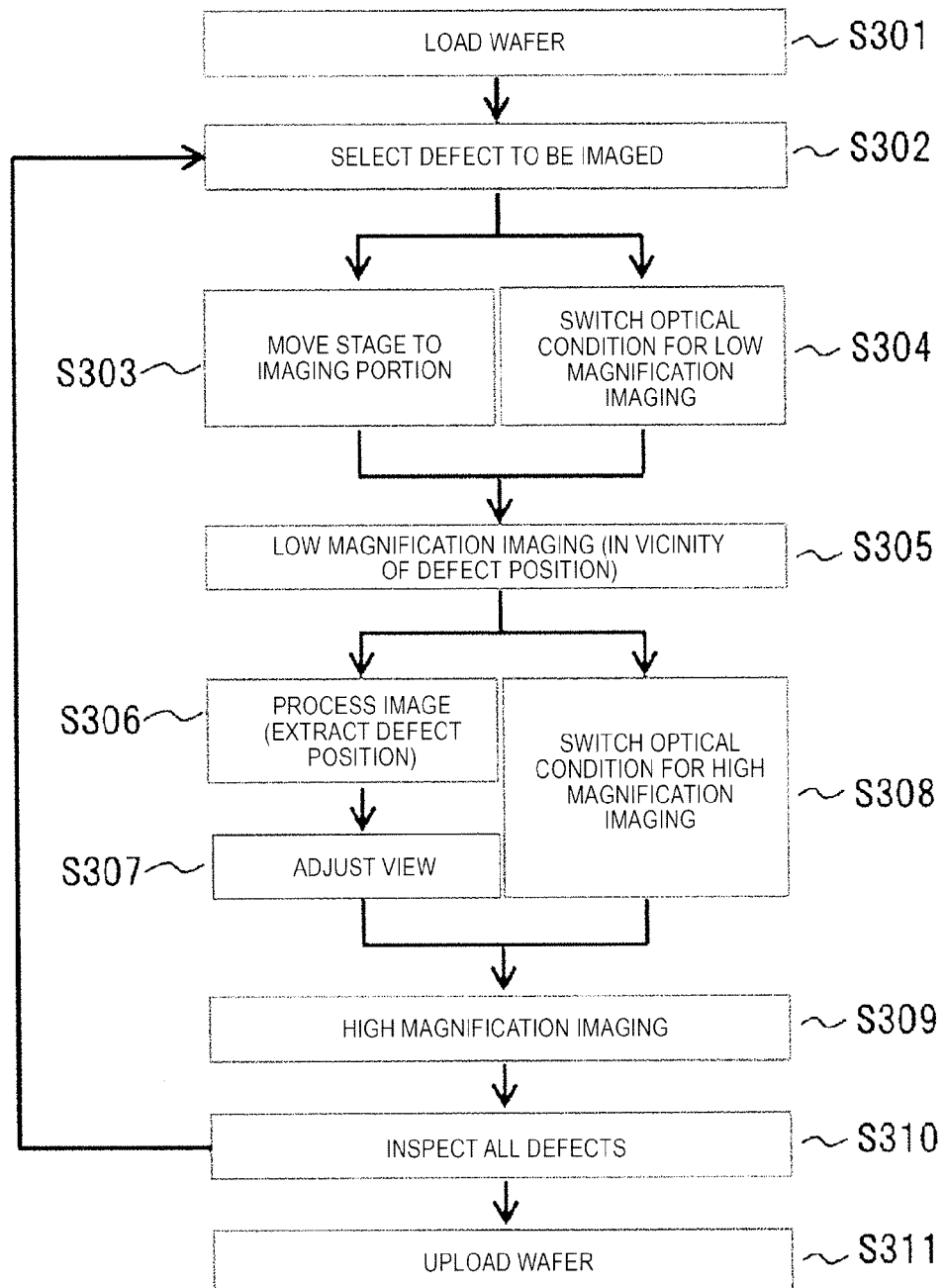
FIG. 3 is a flowchart illustrating a sequence of performing a defect inspection by switching an optical condition.

FIG. 3 is a flowchart illustrating a sequence of performing high-speed continuous imaging with respect to the defect image while switching beam current and the half opening angle. A sequence of imaging the defect image on the wafer by the review SEM of this example will be described with reference to FIG. 3. The following operation is able to be automatically performed by the control of the arithmetic device 133. In addition, a part of the operation is able to be manually performed by using the input device 138.

In S301, the wafer 111 to be subjected to the defect inspection is loaded.

In S302, a defect to be imaged is selected.

In S303, a position of the stage 112 is adjusted such that the selected defect comes in view. At this time, the positioning is performed on the basis of defect position coordinate data stored in the wafer information storage device 136 in advance. The defect position coordinate data is output by an optical defect inspection device, and has low position accuracy compared to the view at the time of high magnification imaging in S309, and thus it is necessary to correct an imaging region such that the defect is positioned in the vicinity of the center of the view at the time of the high magnification imaging by S303 to S307.

In S304, the control value of the condenser lens control electric sources 123 and 125, the electron beam axis adjustment instrument control electric sources 126 and 127, the scanning unit control electric source 128, the objective electromagnetic lens control electric source 129, the objective electrostatic lens control electric source 130, and the detection value adjustment device 131 is set for low magnification imaging by the arithmetic device 133. As the control value, the control value stored in the imaging conditions memory 142, the standby time adjustment memory 141, and the secondary storage device 135 which is adjusted in advance is read. At this time, the standby time 140 is simultaneously read from the standby time adjustment memory 141, and the low magnification imaging of S305 is started after the standby time 140 has elapsed from the starting point of switching the control value of the condenser lens control electric sources 123 and 125.

In S306, image processing is performed with respect to the image imaged in S305 by the image processing unit 139, and a deviation amount of a defect position and a center position of the view is extracted. On the basis of the deviation amount, the control value of the scanning unit control electric source 128 is adjusted such that the defect is in an imaging region positioned in the vicinity of the center of the view in S307. In order to perform the image processing, an image which has the same pattern and does not have a defect is necessary as a reference image. When the reference image is not prepared before starting the defect inspection, the reference image is imaged immediately before S305.

In S308, the control value of the condenser lens control electric sources 123 and 125, the electron beam axis adjustment instrument control electric sources 126 and 127, the scanning unit control electric source 128, the objective electrostatic lens control electric source 130, and the detection value adjustment device 131 is set for the high magnification imaging by the arithmetic device 133. Here, the control value of the objective electromagnetic lens control electric source 129 is not changed. As the control value, the control value stored in the imaging conditions memory 142, the standby time adjustment memory 141, and the secondary storage device 135 which is adjusted in advance is read.

At this time, the standby time 140 is also simultaneously read from the standby time adjustment memory 141, and the high magnification imaging of S309 is started after the standby time 140 has elapsed from the starting point of switching the strength of the convergence effect of the condenser lenses 102 and 103.

In S310, it is checked whether or not imaging of all the defects is completed. When the imaging of all the defects is not completed, the sequence returns to S302, and imaging of a different defect is sequentially performed. When the imaging of all the defects is completed, the wafer is uploaded in S311, and the inspection is completed.

Both a high resolution and a high S/N ratio are required at the time of the high magnification imaging of S309, and when the S/N ratio of the low magnification imaging is identical to that of the high magnification imaging, the resolution may be lower than that of the high magnification imaging. For this reason, by setting a beam current of S304 to be larger than a beam current of S308, it is possible to decrease the number of frames imaged in S305 in inverse proportion to a beam current ratio, and it is possible to shorten an imaging time in S305.

S303 and S304, S306, S307 and S308 are processed by the arithmetic device 133 in parallel. This is because a time shortening effect obtained by decreasing the number of frames at the time of the low magnification imaging avoids being offset by a time period required for switching the beam current. Furthermore, in a different optical condition obtained by S304 and S308, a position of the beam emitted to the wafer 111 may be different. A visual deviation amount due to switching of the optical condition is obtained in advance before starting the inspection, and may be corrected such that a visual deviation at the time of a visual adjustment in S308 is offset. The visual deviation amount is imaged in a different optical condition by using a sample for adjustment, and may be obtained by an image comparison method. At this time, by setting an imaging magnification in both of the optical conditions to be high, it is possible to obtain the visual deviation amount with high accuracy.

As described above, a case where a setting value of the beam current and the half opening angle before and after the switching is not able to be selected is described, and hereinafter, a case where the beam current and the half opening angle are able to be selected will be described.

FIG. 4 is an example of a setting screen of an imaging condition. Setting of the imaging condition used in S304 and S308 will be described with reference to FIG. 4. An imaging region is designated by a length of a side of a square imaging region, and is able to be freely designated by a numerical value. Similarly, a scanning speed is also designated by a numerical value. On the basis of this setting, the control value of the scanning unit control electric source 128 is determined. In addition, an image size, the number of frames, and the like are able to be set.

The beam current and the half opening angle are able to be selected from a plurality of options which is set in advance. In order to do this, it is necessary that the control value of the condenser lens control electric sources 123 and 125 corresponding to the beam current and the half opening angle be stored in the imaging conditions memory.

In order to select the beam current from M options and the half opening angle from N options, it is necessary that M*(M−1)*N*(N−1) sets of control values be stored in the standby time adjustment memory 141 when the standby time is not changed. M*(M−1) is the number of all combinations obtained in switching of the beam current when the same beam current is not selected, and N*(N−1) is the number of all combinations obtained in switching the half opening angle when the same half opening angle is not selected.

However, when M is 1 and N is 1, that is, when the setting value of the beam current and the half opening angle is not selected before and after the switching, the control value of the condenser lens control electric sources 123 and 125 before switching the beam current and the half opening angle is obvious, and thus may not be stored in the standby time adjustment memory 141.

Furthermore, a case where the electromagnetic lens is used for both of the condenser lenses 102 and 103 is described, and an electrostatic lens may be used for any one of the condenser lenses 102 and 103. When the electrostatic lens is used for the condenser lens 102, the phase compensation circuit 122 may not be used. Similarly, when the electrostatic lens is used for the condenser lens 103, the phase compensation circuit 124 may not be used.

Hereinafter, the flowchart and the setting screen at the time of controlling both of the half opening angle and the beam current are described with reference to FIG. 3 and FIG. 4, but both of the half opening angle and the beam current are not necessarily controlled, and any one of the half opening angle and the beam current may be controlled.

When only the half opening angle is switched, in FIGS. 1A and 1B, in particular, the electromagnetic lens is used for the condenser lens 103 which is away from the charged particle beam source, and the phase compensation circuit 124 is disposed in parallel with the condenser lens 103. Any one of the electromagnetic lens and the electrostatic lens may be used for the condenser lens 102. The phase compensation circuit 122 may not be used.

In addition, the sequence of FIG. 3 is changed as follows. That is, in S308, the control value of the condenser lens control electric source 125, the electron beam axis adjustment instrument control electric source 127, the scanning unit control electric source 128, and the objective electrostatic lens control electric source 130 is set for the high magnification imaging by the arithmetic device 133. Here, the control value of the condenser lens control electric source 123, the objective electromagnetic lens control electric source 129, and the detector adjustment device 131 is not changed. As the setting value, the setting value stored in the imaging conditions memory 142, the standby time adjustment memory 141, and the secondary storage device 135 which is adjusted in advance is read. At this time, the standby time 140 is also simultaneously read, and the high magnification imaging of S309 is started after the standby time from the starting point of switching the strength of the convergence effect of the condenser lens 103.

Furthermore, in S304, in order to easily search for defects having different heights, the half opening angle is decreased by giving priority to a deep focal depth, on the other hand, detailed observation is performed in S308, and it is necessary that an optimal half opening angle be set by giving priority to a high resolution. Therefore, the adjustment value of the condenser lens control electric source 125 stored in the memory 134 and the secondary storage device 135 in advance is set such that the half opening angle of S304 is smaller than the half opening angle of S308.

In addition, when only the beam current is switched, in FIGS. 1A and 1B, in particular, the electromagnetic lens is used for the condenser lens 102 which is close to the charged particle beam source, and the phase compensation circuit 122 is disposed between the condenser lens 102 and the condenser lens control electric source 123. Any one of the electromagnetic lens and the electrostatic lens may be used for the condenser lens 103. The phase compensation circuit 124 may not be used.

In addition, the sequence of FIG. 3 is changed as follows. That is, in S308, the control value of the condenser lens control electric source 123, the electron beam axis adjustment instrument control electric sources 126 and 127, the scanning unit control electric source 128, the objective electrostatic lens control electric source 130, and the detection value adjustment device 131 is set for the high magnification imaging by the arithmetic device 133. Here, the control value of the condenser lens control electric source 125 and the objective electromagnetic lens control electric source 129 is not changed. As the setting value, the setting value stored in the imaging conditions memory 142, the standby time adjustment memory 141, and the secondary storage device 135 which is adjusted in advance is read. At this time, the standby time 140 is also simultaneously read, and the high magnification imaging of S309 is started after the standby time from the starting point of switching the strength of the convergence effect of the condenser lens 102.

Example 2

In this example, a case where the standby time 140 is able to be changed by mode selection in the review SEM of one embodiment according to the invention will be described.

A configuration of the review SEM of this example is based on Example 1. In Example 1, a case where only the control value of the standby time 140 determined in advance is stored in the standby time adjustment memory 141 is described, but in this example, a control value of a plurality of different standby times 140 is stored.

FIG. 5 is an example of a mode selection screen of the standby time 140. A setting method of the standby time will be described with reference to FIG. 5.

The standby time 140 is as described in Example 1, and the variation in the image quality due to the variation in the strength of the convergence effect of the electromagnetic lens within one imaging time is set to a value in an allowable range. However, in a case of throughput priority and a case of accuracy priority, allowable ranges of the variation in the image quality are different from each other. Therefore, as illustrated in FIG. 5, the mode selection of the standby time 140 is performed on the basis of a display screen. In the mode selection screen, a mode selecting the standby time 140 from various values set in advance such as a mode in which the standby time becomes the shortest standby time in a range where the variation in the image quality converges to the allowable range, and a mode in which the variation in the image quality priorly becomes the smallest variation is able to be selected. In addition, a predicted value of a variation width in the imaging time of the beam current and the half opening angle of setting in each mode is displayed.

In order to correspond to the plurality of different standby times 140, the control value of each standby time 140 may be obtained in advance and may be stored in the standby time adjustment memory 141. At this time, the adjustment method is on the basis of the method of Example 1. Furthermore, in order to select the beam current from M options, the half opening angle from N options, and the standby time from T options, $M*(M-1)*N*(N-1)*T$ sets of control values described in Example 1 may be in the standby time adjustment memory 141.

In Example 1, the standby time 140 is set for each individual imaging, and the optical condition is changed for each individual imaging, but as other modification examples, a different standby time 140 may set for each individual scanning and each individual pixel.

In this case, it is necessary that the control value of the condenser lens control electric sources 123 and 125 before and after the switching, and the standby time 140 from a starting point of change of the control value of the condenser lens control electric sources 123 and 125 to an imaging starting point, and a combination of the respective control values of the electron beam axis adjustment instrument control electric sources 126 and 127, the objective electromagnetic lens control electric source 129, the objective electrostatic lens control electric source 130, and the detection value adjustment device 131 be stored in the standby time adjustment memory 141 in advance. At this time, an adjustment method of the respective control values is on the basis of the method of Example 1.

According to the method described above, in the imaging of one image, the optical condition is able to be adjusted according to the variation over time in the strength of the convergence effect of the electromagnetic lens. As a result thereof, the standby time 140 is able to be shortened compared to that in Example 1.

Example 3

In this example, a case where a different standby time 140 is set for each frame when a plurality of frames is imaged in imaging of one image in a review SEM of one embodiment according to the invention, and a control value according to each standby time 140 is stored in the standby time adjustment memory 141 will be described.

A configuration of the review SEM according to this example is based on Example 1. In Example 1, a case the plurality of frames is imaged in one imaging when where the plurality of frames is continuously imaged is described, and in this example, a case where each frame is considered as imaging of a different standby time 140 will be described.

Figure 6:
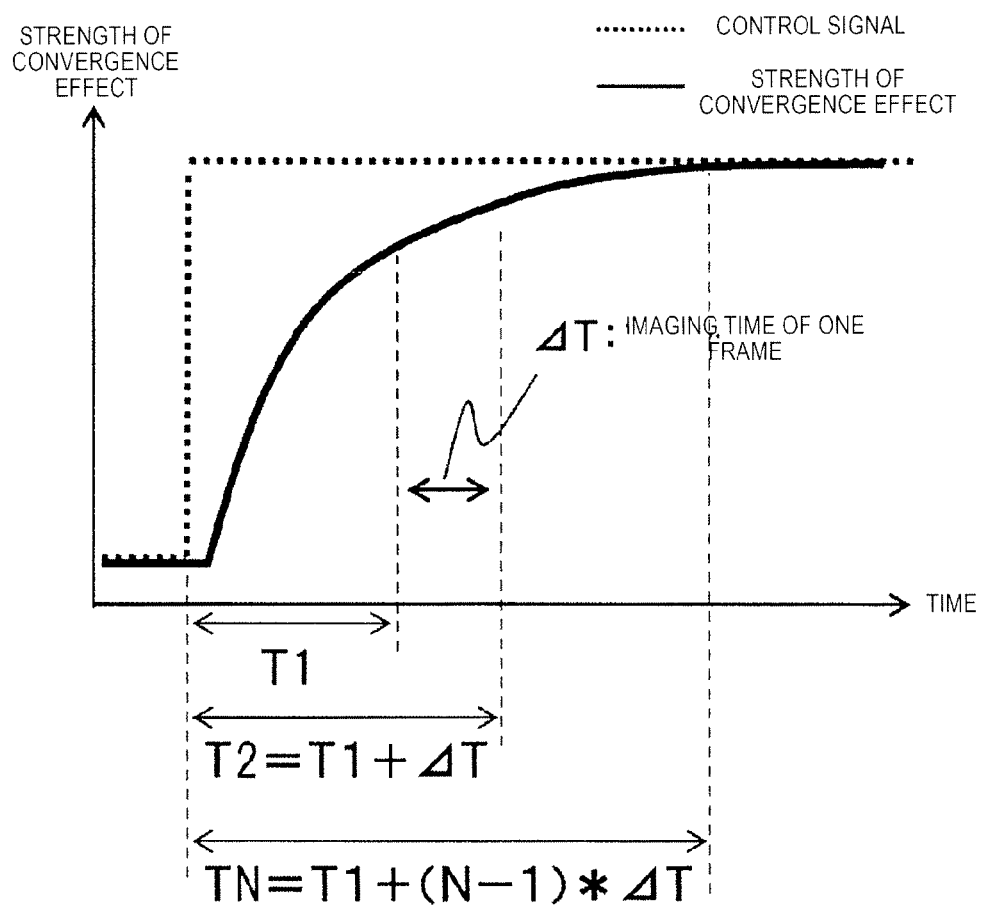
FIG. 6 is an example of a standby time and a strength of a convergence effect of a lens when a plurality of frames is imaged.

FIG. 6 illustrates a relationship between the strength of the convergence effect of a lens and the standby time 140 when a plurality of frames is imaged.

The standby time 140 at the time of imaging the plurality of frames will be described with reference to FIG. 6. When the standby time 140 of a first frame is T1, and an imaging time of one frame is ΔT, imaging of a second frame is imaging of one frame in which the standby time 140 is T2=T1+ΔT. Upon expansion, imaging of an N-th frame is imaging of one frame in which the standby time 140 is TN=T1+(N−1)*ΔT.

Furthermore, the strength of the convergence effect of the lens is different for each frame, and thus it is necessary that a control parameter corresponding to a plurality of different standby times, that is, the control value of the condenser lens control electric sources 123 and 125 before and after switching all frames, the standby time 140 from a starting point of change of a control value of the condenser lens control electric sources 123 and 125 to a starting point of imaging of each frame, and a combination of the respective control values of the electron beam axis adjustment instrument control electric sources 126 and 127, the objective electromagnetic lens control electric source 129, the objective electrostatic lens control electric source 130, and the detection value adjustment device 131 be stored in the standby time adjustment memory 141 in advance. An adjustment method of the respective control values of the electron beam axis adjustment instrument control electric sources 126 and 127, the objective electromagnetic lens control electric source 129, the objective electrostatic lens control electric source 130, and the detection value adjustment device 131 of each standby time 140 is on the basis of the method of Example 1.

According to the method described above, in imaging of the plurality of frames, an optical condition is able to be adjusted for each frame according to a variation over time in the strength of the convergence effect of the electromagnetic lens. As a result thereof, the standby time 140 is able to be shorter than that of Example 1.

Example 4

In this example, as a review SEM of one embodiment according to the invention, a configuration of the review SEM in which a plurality of electron detectors is mounted, and a sequence performing a defect inspection while switching the electron detector at the time of switching a beam current by using the review SEM according to this example will be described.

In Examples 1 to 3, a case where only one electron detector 110 is used is described. Here, in the electron detector 110, in general, a combination of a scintillator and a photomultiplier is used. In this case, in order to change a gain of the detector 110 according to the switching of the beam current, it is necessary that a control value due to a voltage or a current of the detection value adjustment device 131 be switched, and a time period from switching of the control value of the detection value adjustment device 131 to switching of the gain of the electron detector 110 be approximately tens of ms to hundreds of ms. For this reason, even when a switching time of the strength of the convergence effect of the electromagnetic lens is able to shortened, it is necessary that the standby time 140 be set to be longer than a gain switching time of the detector 110, and thus the standby time 140 may not be shortened. The defect inspection is performed while switching the plurality of electron detectors, and thus a related problem is solved.

Figure 7:
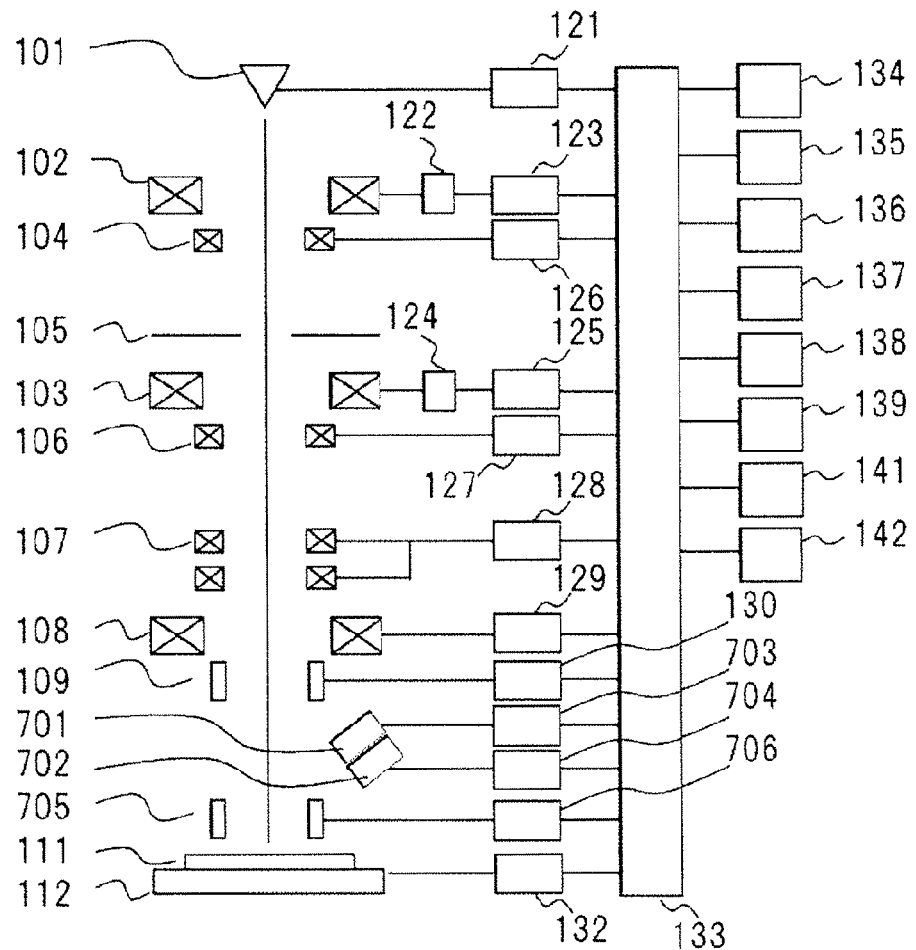
FIG. 7 is a configuration diagram of a charged particle beam apparatus switching a plurality of detectors.

FIG. 7 is an example of a configuration diagram of a review SEM according to this example. The review SEM according to this embodiment is on the basis of the configuration of Example 1, and includes electron detectors 701 and 702, detection signal adjustment devices 703 and 704, an ExB deflector 705, an ExB deflector control electric source 706, and the like instead of the electron detector 110, the detection value adjustment device 131, and the like.

The ExB deflector 705 is an ExB (E cross B) type deflector, a trajectory of a beam is not deflected, and only a trajectory of secondary electrons and reflected charged particles is able to be deflected. By changing a setting value of the ExB deflector control electric source 706 by the arithmetic device 133, the detector to be used is able to be switched.

In addition, the sequence of FIG. 3 is changed as follows. That is, when the beam current and the half opening angle are switched in S304, an aligner control electric source 706 is controlled by the arithmetic device 133 such that the electron detector 701 which is adjusted is used in a beam current for low magnification imaging. Then, when the beam current and the half opening angle are switched in S308, the aligner control electric source 706 is controlled by the arithmetic device 133 such that the electron detector 702 which is adjusted is used in a beam current for high magnification imaging.

Example 5

In this example, a sequence in which a defect is imaged by suppressing charging in the review SEM according to Example 1 will be described.

Figure 8:
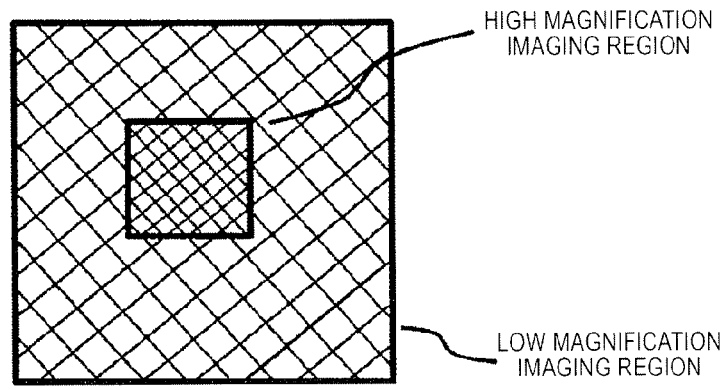
FIG. 8 is an example of a difference in beam current density between a high magnification imaging region and a low magnification imaging region.

FIG. 8 illustrates an example of a difference in beam current density per one frame when low magnification imaging and high magnification imaging are continuously performed by the sequence of FIG. 3.

In the review SEM according to this embodiment, it is possible to perform the imaging by rapidly switching a beam current, and as illustrated in FIG. 8, when beam current density is different between a region of the low magnification imaging and a region of the high magnification imaging, in the high magnification imaging, an end portion of view is influenced by the charging due to the beam current emitted at the time of the low magnification imaging, and thus image shaking, a variation in contrast, and the like may occur. As a result thereof, even when the beam current is able to be switched rapidly, the defect may not be imaged with high accuracy.

Therefore, in this example, a sequence for imaging a defect by suppressing an influence of charging will be described.

This sequence is based on Example 1, and thus a difference from Example 1 will be described with reference to FIG. 3. In S305 and S309, when a case where density of a beam current per one frame emitted to an imaging region is different is general, and a defect of a wafer which is easily charged is imaged, an influence of charging a surface due to the beam current in S305 remains at the time of performing the imaging of S309, and a variation over time occurs in a wafer surface potential during an imaging time. As a result thereof, when the standby time 140 is shortened, a variation in image quality due to image shaking, a variation in image contrast, and the like may occur.

In order to avoid this problem, a beam current, the number of frames, an imaging time, and an imaging region are selected such that the density of the beam current per one frame emitted in S305 and S309 is constant.

Here, a method in which a beam current value in S305 is IL, the number of frames is FL, an imaging time of one frame is TL, an area of an imaging region is SL, a beam current value in S309 is IH, the number of frames is FH, an imaging time of one frame is TH, an area of imaging region is SH, and thus each parameter is determined will be described.

A condition in which the current density per one frame in S305 and S309 is constant is able to be indicated by IL*TL/SL=IH*TH/SH.

This expression indicates that a plurality of combinations of parameters of the beam current value which is identical to a value obtained by dividing a product of the beam current value and the imaging time of an image of one frame by the area of the imaging region, the imaging time, and the area of the imaging region is stored in the imaging conditions memory 142, and it is necessary to switch the beam current value by using the combination of the parameters in order to image the defect by suppressing the influence of the charging.

In addition, a condition in which an S/N ratio is constant in S305 and S309 is able to be indicated by IL*TL*FL=IH*TH*FH. By making the two expressions described above compatible, the defect is able to be imaged without image shaking, and a variation in image contrast due to the charging.

FIG. 4 is an example of a parameter setting screen for suppressing the charging. The current density per one frame is calculated and displayed all the time on the basis of the beam current, the imaging region, the number of frames, and a scanning speed, and thus it is possible to set each of the parameters such that saturation of image shaking and image contrast due to the charging is suppressed at the time of switching the low magnification imaging and the high magnification imaging.

Example 6

In this example, a configuration of a length measurement SEM of one embodiment according to the invention, and a sequence of a length measurement by the length measurement SEM of this embodiment will be described. The length measurement SEM of this embodiment is on the basis of the configuration of Example 1. However, the image processing unit 139 has a length measurement function of a width or the like of a pattern formed on a wafer.

Figure 9:
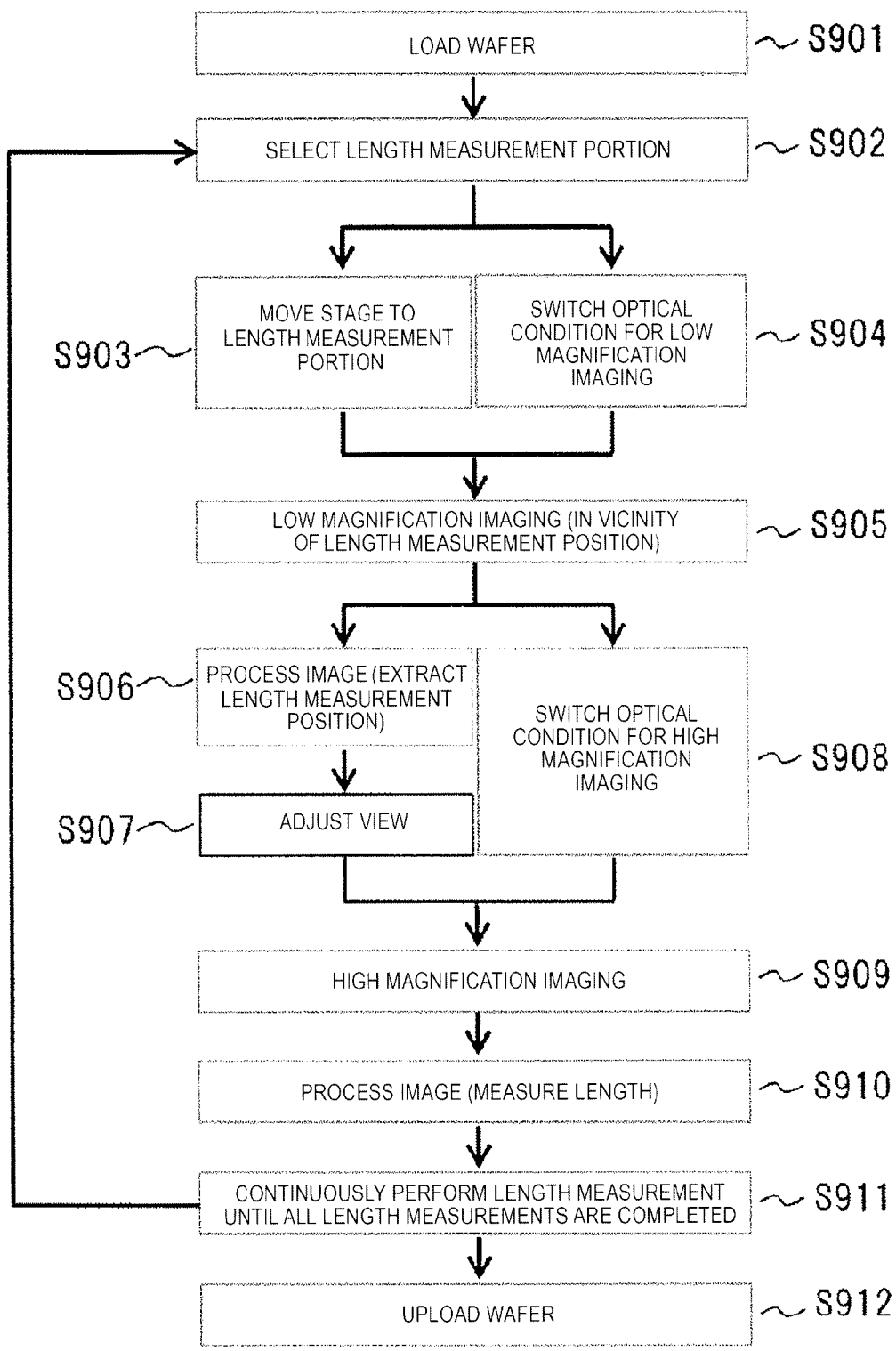
FIG. 9 is a flowchart illustrating a sequence of performing length measurement by switching an optical condition.

FIG. 9 is an example of a flowchart illustrating a sequence of the length measurement by the length measurement SEM of this embodiment. The sequence of the length measurement using the length measurement SEM of this embodiment will be described with reference to FIG. 9.

In S901, the wafer 111 to be subjected to the length measurement of a pattern is loaded, and a pattern of a length measurement target is selected in S902.

In S903, the position of the stage 112 is adjusted such that a pattern for addressing of which a positional relationship with respect to the pattern of the selected length measurement target is known comes in view. The position adjustment is performed on the basis of position information of the pattern for addressing registered in the wafer information storage device 136 in advance. Furthermore, it is necessary that registration of the pattern for addressing and registration of a position deviation amount between the pattern for addressing and the pattern of the length measurement target be performed by the user using the input device 138 before starting the inspection. The registration may be performed between S901 and S902.

In S904, the control value of the condenser lens control electric sources 123 and 125, the electron beam axis adjustment instrument control electric sources 126 and 127, the scanning unit control electric source 128, the objective electromagnetic lens control electric source 129, the objective electrostatic lens control electric source 130, and the detection value adjustment device 131 is set for low magnification imaging by the arithmetic device 133. As the setting value, the setting value stored in the memory 134 and the secondary storage device 135 which is adjusted in advance is read.

At this time, the standby time 140 is also simultaneously read, and the low magnification imaging of S905 is started after the standby time 140 has elapsed from a starting point of switching the control value of the condenser lens control electric sources 123 and 125.

In S906, image processing of the image imaged in S905 is performed, a deviation amount between a pattern position for addressing and a center position of the view is extracted, and the control value of the scanning unit control electric source 128 is adjusted such that the pattern of the length measurement target is in an imaging region positioned in the center of the view in S907.

In S908, the control value of the condenser lens control electric sources 123 and 125, the electron beam axis adjustment instrument control electric sources 126 and 127, the scanning unit control electric source 128, the objective electrostatic lens control electric source 130, and the detection value adjustment device 131 is set for the high magnification imaging by the arithmetic device 133. Here, the control value of the objective electromagnetic lens control electric source 129 is not changed. As the setting value, the setting value stored in the memory 134 and the secondary storage device 135 which is adjusted in advance is read. At this time, the standby time 140 is also simultaneously read, and the high magnification imaging of S909 is started after the standby time from a starting point of switching the strength of the convergence effect of the condenser lenses 102 and 103.

In S910, the image processing of the image imaged in S909 and the length measurement of the pattern are performed, a length measurement value and position coordinate information of the pattern being stored in the memory 134 and the secondary storage device 135.

A beam current varies due to the variation in the strength of the convergence effect of the condenser lens 102, a contrast variation may occur in the imaged image, and a variation in the length measurement value due to the contrast variation may occur. Therefore, in the image processing of S910, an amount of variation in the beam current may be predicted from a predicted value of an amount of variation in the strength of the convergence effect of the condenser lens 102, and contrast may be corrected in inverse proportion to the beam current. As other image processing methods, an approximation function of position dependency of the amount of variation in contrast may be obtained from a difference in contrast of the image between the vicinity of a scanning start position and the vicinity of a scanning end position of the image, and the contrast may be corrected on the basis of the approximation function.

It is checked whether or not the length measurement of all the patterns is completed in S911. When the length measurement of all the patterns is not completed, the sequence returns to S902, and the length measurement of a different pattern is sequentially performed. When the length measurement of all the patterns is completed, the wafer is uploaded in S912, and the length measurement is completed. Setting of the beam current and the number of frames is identical to that of Example 1.

Example 7

In this example, a sequence in which the surface of the wafer ill is irradiated with the beam before a low magnification image-imaging, and a charging state of the surface is intentionally changed in the review SEM of Example 1 or the length measurement SEM of Example 6 will be described. Furthermore, a case where the method is applied to the review SEM of the Example 1 will be described in order to easily understand the description, but the same method is able to be applied to the length measurement SEM of Example 6.

Figure 10:
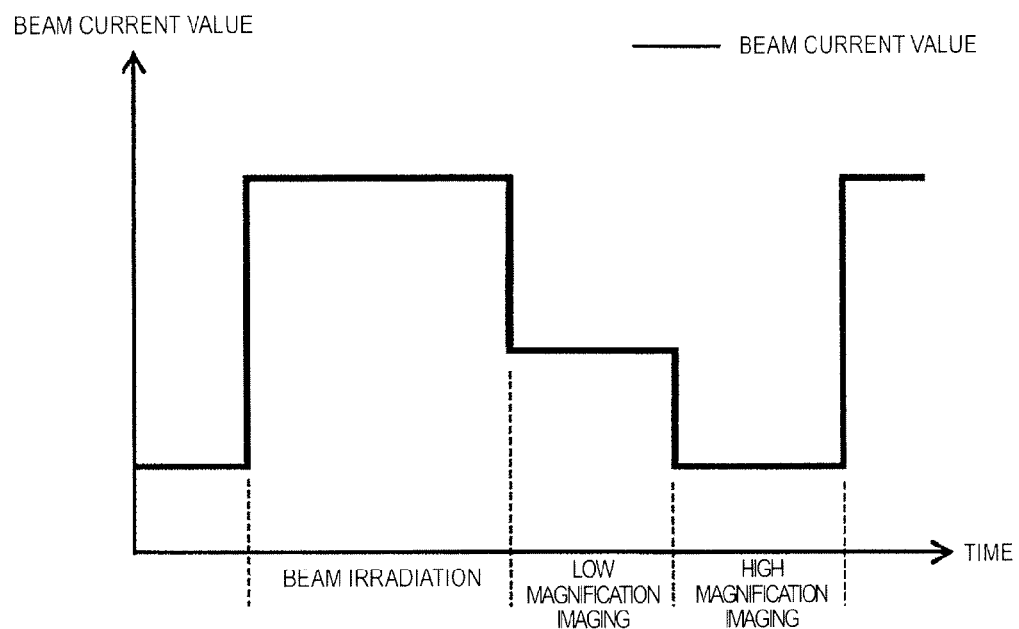
FIG. 10 is an example of a beam current value when surface charging is performed by beam irradiation.

FIG. 10 is a schematic view illustrating a beam current value at the time of the beam irradiation, the low magnification imaging, and the high magnification imaging. As illustrated in FIG. 10, a beam current larger than that of the low magnification imaging is emitted, then similar to Example 1, the low magnification imaging is performed by a beam current for low magnification imaging, and then the high magnification imaging is performed by a beam current smaller than that of the low magnification imaging. Hereinafter, a sequence for switching these three types of beam currents will be described.

Figure 11:
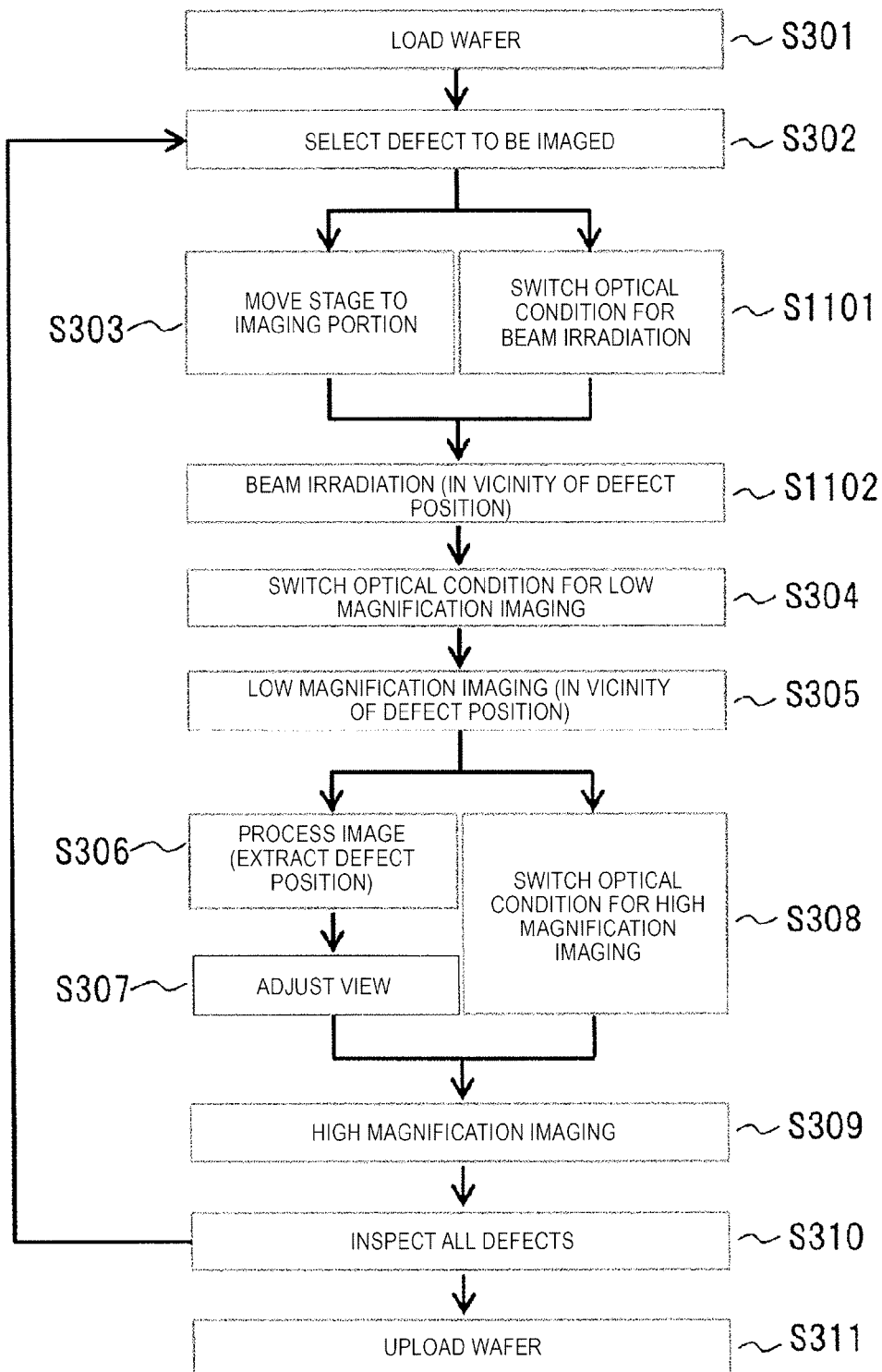
FIG. 11 is a flowchart illustrating a sequence of performing a defect inspection after the beam irradiation.

FIG. 11 is a sequence of the defect inspection when the surface of the wafer 111 is irradiated with the beam before the magnification image-imaging. When this sequence is compared with the sequence of FIG. 3 described in Example 1, S1101 and S1102 are added. A difference from the sequence of Example 1 will be described.

S1101 is performed in parallel with S303. In S1101, the control value of the condenser lens control electric sources 123 and 125, the electron beam axis adjustment instrument control electric sources 126 and 127, the scanning unit control electric source 128, the objective electromagnetic lens control electric source 129, the objective electrostatic lens control electric source 130, and the detection value adjustment device 131 is set for the beam irradiation by the arithmetic device 133. As the control value, the control value stored in the imaging conditions memory 142, the standby time adjustment memory 141, and the secondary storage device 135 which is adjusted in advance is read.

At this time, the standby time 140 is also simultaneously read from the standby time adjustment memory 141, and the beam irradiation of S1102 is started after the standby time 140 has elapsed from a starting point of switching of the control value of the condenser lens control electric sources 123 and 125.

However, S1102 is for changing image contrast in S305 and S309 by irradiating the surface of the wafer 111 with the beam, and thus an allowable range of a beam current obtained by being compared with a case of imaging or a half opening angle is wide. Therefore, the control may not be performed by the standby time 140, and S1102 may be started immediately after switching the control value of the condenser lens control electric sources 123 and 125.

The wafer 111 is irradiated with the beam in S1102, an optical condition for low magnification imaging is switched in S304, and the low magnification imaging in the vicinity of the defect position is performed in S305.

When there is a defect having different conductivity in the wafer, and when there is no defect in general high magnification imaging, a charging state is changed by the processing of S1102, and thus the contrast of the image is changed, and the defect may not be easily extracted. In this case, the method of this example is effective.

Furthermore, as described in S1101, S304, and S308, it is necessary that each beam current, and the control value of each standby time 140 be obtained in advance and be stored in the standby time adjustment memory 141 in order to correspond to three or more types of beam current. At this time, the adjustment method is on the basis of the method of Example 1.

Example 8

In this example, a configuration of a general SEM of one embodiment according to the invention, and an operation of observation by the general SEM of this embodiment will be described.

Figure 12:
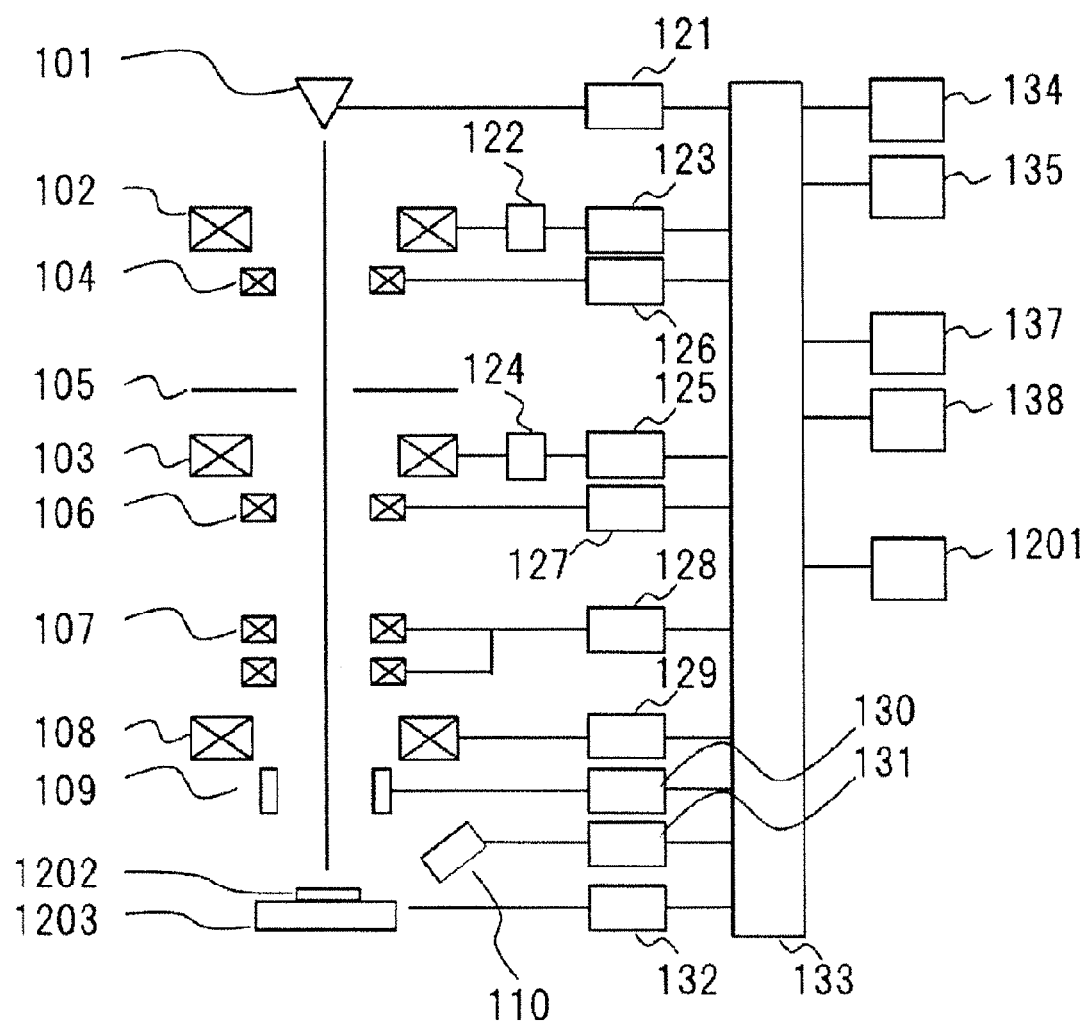
FIG. 12 is a configuration diagram of a charged particle beam apparatus according to one embodiment of the invention.

The configuration of the general SEM according to this embodiment will be described with reference to FIG. 12. The general SEM according to this embodiment includes an optical condition memory 1201, a sample 1202, and a sample stage 1203 in addition to the constituents of the same reference numerals as that of Example 1.

Next, the operation of the general SEM according to this embodiment will be described with reference to FIG. 12. However, the description of the same parts as that of Example 1 will be omitted.

An electron beam emitted to the sample 1202 is regulated by the objective diaphragm 105. Further, the electron beam is deflected by the scanning unit 107 to be emitted to a desired position of the sample 1202, is conversed by the objective electromagnetic lens 108, and the objective electrostatic lens 109, and is emitted to an observation target of the sample 1202. When the sample 1202 is irradiated with the electron beam, secondary electrons and reflected electrons are emitted from the sample 1202, and a signal is detected by the electron detector 110. The sample stage 1203 and the stage driving electric source 132 move the sample 1202, and an arbitrary position of the sample 1202 is able to be imaged.

The optical condition memory 1201 and the secondary storage device 135 are able to store the control value of the condenser lens control electric sources 123 and 125, and a plurality of combinations of the respective control values of the electron beam axis adjustment instrument control electric sources 126 and 127, the scanning unit control electric source 128, the objective electromagnetic lens control electric source 129, the objective electrostatic lens control electric source 130, and the detection value adjustment device 131.

The arithmetic device 133 is able to control the condenser lens control electric sources 123 and 125, the electron beam axis adjustment instrument control electric sources 126 and 127, the scanning unit control electric source 128, the objective electromagnetic lens control electric source 129, the objective electrostatic lens control electric source 130, and the detection value adjustment device 131 and is able to synchronously process each control.

The display device 137 is able to display the image stored in the memory 134 or the secondary storage device 135. In addition, the user is able to set various operations of this apparatus by using the input device 138.

Furthermore, the electromagnetic lens is used for the condenser lenses 102 and 103, the phase compensation circuit 122 is disposed in parallel with the condenser lens 102, and the phase compensation circuit 124 is disposed in parallel with the condenser lens 103.

Next, an observation method of the sample 1202 using the general SEM according to this embodiment will be described.

The user is able to designate all of a beam current, a half opening angle, a beam convergence position, brightness and contrast of the image, the control value of the electron beam axis adjustment instrument control electric sources 126 and 127, and the like as an arbitrary value by the input device 138, and is able to adjust image quality. The control value of the condenser lens control electric sources 123 and 125, the objective electromagnetic lens control electric source 129, the objective electrostatic lens control electric source 130, and the detection value adjustment device 131 according to each designation value of the user is calculated and set by the arithmetic device 133.

The user is able to adjust the beam current, the half opening angle, the beam convergence position, the brightness and the contrast of the image, and the control value of the electron beam axis adjustment instrument control electric sources 126 and 127 such that the image quality is in an allowable range while confirming the image quality by the display device 137, and then is able to start the imaging by manipulating the input device 138. As described above, each control value obtained by being adjusted is able to be registered in the optical condition memory 1201. In addition, each control value which is registered is able to be called.

In general, in the general SEM using the electromagnetic lens for the beam current control means and the half opening angle control means, when the beam current, and a value of the half opening angle are changed by the input device 138, it takes time for a variation in the strength of the convergence effect of the condenser lenses 102 and 103 to converge, and thus the user confirms the image displayed on the display device 137, and when a variation in image quality is in an allowable range, the user manipulates the input device 138, and stores the image in the secondary storage device 135.

However, in the general SEM according to this example, the phase compensation circuits 122 and 124 are disposed, and thus a convergence time of a variation over time of the condenser lenses 102 and 103 is considerably shortened. For this reason, the user changes the beam current, and the half opening angle by the input device 138, and a time period required for starting the imaging by manipulating the input device 138 again is longer than the standby time until the variation in the image quality is stable. Therefore, the user is able to start the imaging with desired image quality immediately after changing the beam current and the half opening angle.

What is claimed is:

1. A charged particle beam apparatus, comprising:
   a charged particle beam source which irradiates a sample with a charged particle beam;
   an electromagnetic lens;
   a lens control electric source for controlling strength of a convergence effect of the electromagnetic lens; and
   a phase compensation circuit which is connected to the lens control electric source in parallel with the electromagnetic lens, and controls a lens current at the time of switching the strength of the convergence effect of the electromagnetic lens such that the lens current monotonically increases or monotonically decreases.

2. The charged particle beam apparatus according to claim 1, further comprising:
   a detector which detects secondary charged particles occurring due to irradiating the sample with the charged particle beam;
   an image forming unit which forms an image based on a signal of the detector;
   a standby time control unit which controls a standby time from switching the strength of the convergence effect of the electromagnetic lens to starting image generation of the sample; and
   a standby time adjustment memory which stores a plurality of control parameters of the charged particle beam apparatus corresponding to the standby time and a control value of the electromagnetic lens.

3. The charged particle beam apparatus according to claim 2,
   wherein the standby time control unit sets the standby time to be within a time period during which a variation in image quality based on a variation in the strength of the convergence effect of the electromagnetic lens within a forming time of one image by the image forming unit converges to a predetermined range.

4. The charged particle beam apparatus according to claim 3,
   wherein the standby time control unit sets the standby time to be a lower limit value within the predetermined range.

5. The charged particle beam apparatus according to claim 2,
   wherein the control parameter includes at least one of a deflection control value of the charged particle beam, a control value of signal gain of the detector, and a control value of a beam convergence control unit which controls convergence of the charged particle beam with respect to the sample.

6. The charged particle beam apparatus according to claim 2,
   wherein the control parameters include a control parameter corresponding to a mode having the shortest standby time under a condition in which a variation in image quality of the image converges to a predetermined range, and a control parameter corresponding to a plurality of modes including a mode having the smallest variation in the image quality of the image.

7. The charged particle beam apparatus according to claim 2,
   wherein the plurality of control parameters includes a control parameter corresponding to a different standby time.

8. The charged particle beam apparatus according to claim 2,
   wherein the charged particle beam source irradiates the sample with the charged particle beam corresponding to three or more types of beam current, and
   the standby time adjustment memory stores the control parameter corresponding to the three or more types of beam current.

9. The charged particle beam apparatus according to claim 2, further comprising:
   a beam current control unit which controls a beam current of the charged particle beam, wherein when a control value of the beam current control unit is switched, a control value read from the standby time adjustment memory before starting the switching or within the standby time from a starting point of the switching is used.

10. The charged particle beam apparatus according to claim 2,
wherein the standby time adjustment memory stores a plurality of combinations of the forming time, the beam current, and the imaging region having the same value which is obtained by dividing a product of the forming time of one image by the image forming unit and the beam current of the charged particle beam by the imaging region of the image as the control parameter, and
the charged particle beam apparatus switches the beam current by using the combination of the control parameters.

11. The charged particle beam apparatus according to claim 1,
wherein the phase compensation circuit is disposed in any one of a beam convergence control unit which controls convergence of the charged particle beam with respect to the sample, a beam current control unit which controls a beam current of the charged particle beam, and a half opening angle control unit which controls a half opening angle of the charged particle beam.

12. The charged particle beam apparatus according to claim 1,
wherein in a convergence portion of the charged particle beam, the electromagnetic lens and an electrostatic lens are included, and
when a beam current or a half opening angle of the charged particle beam is changed, the strength of the convergence effect of the electromagnetic lens is set to be constant, and strength of a convergence effect of the electrostatic lens is switched.

* * * * *